United States Patent
Dewitt et al.

(10) Patent No.: US 9,553,348 B2
(45) Date of Patent: Jan. 24, 2017

(54) ON-CHIP VERTICAL THREE DIMENSIONAL MICROSTRIP LINE WITH CHARACTERISTIC IMPEDANCE TUNING TECHNIQUE AND DESIGN STRUCTURES

(71) Applicant: INTERNATIONAL BUSINESS MACHINES CORPORATION, Armonk, NY (US)

(72) Inventors: Barbara S. Dewitt, Essex Junction, VT (US); Essam Mina, South Burlington, VT (US); BM Farid Rahman, Columbia, SC (US); Guoan Wang, Columbia, SC (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/097,648

(22) Filed: Apr. 13, 2016

(65) Prior Publication Data
US 2016/0226123 A1 Aug. 4, 2016

Related U.S. Application Data

(63) Continuation of application No. 13/974,804, filed on Aug. 23, 2013, now Pat. No. 9,362,606.

(51) Int. Cl.
*H01P 3/08* (2006.01)
*H01P 5/04* (2006.01)
(Continued)

(52) U.S. Cl.
CPC ............. *H01P 5/04* (2013.01); *G06F 17/5077* (2013.01); *H01L 21/768* (2013.01); *H01L 23/5222* (2013.01); *H01L 23/66* (2013.01); *H01P 1/203* (2013.01); *H01P 3/081* (2013.01); *H01P 3/082* (2013.01); *H01P 5/12* (2013.01); *H01P 11/003* (2013.01); *H03H 7/38* (2013.01); *H01L 2223/6627* (2013.01); *H01L 2924/0002* (2013.01)

(58) Field of Classification Search
None
See application file for complete search history.

(56) References Cited

U.S. PATENT DOCUMENTS 4,647,878 A    3/1987   Landis et al.
5,017,509 A * 5/1991   Tuckerman ........... H01P 11/003
                                             438/622

(Continued)

OTHER PUBLICATIONS

Huang, J. et al., "Vertical-Ground-Plane Transmission Lines for Miniaturized Silicon-Based MMICs", IEEE, Radio Frequency Integrated Circuits (RFIC) Symposium, 2007, pp. 563-566.

*Primary Examiner* — Thomas J Hiltunen
(74) *Attorney, Agent, or Firm* — Bryan Bortnick; Andrew M. Calderon; Roberts Mlotkowski Safran, Cole & Calderon, P.C.

(57) ABSTRACT

A vertical three dimensional (3D) microstrip line structure for improved tunable characteristic impedance, methods of manufacturing the same and design structures are provided. More specifically, a method is provided that includes forming a first microstrip line structure within a back end of the line (BEOL) stack. The method further includes forming a second microstrip line structure separated from the BEOL stack by a predetermined horizontal distance.

12 Claims, 8 Drawing Sheets

(51) Int. Cl.
*G06F 17/50* (2006.01)
*H01L 23/66* (2006.01)
*H01P 11/00* (2006.01)
*H01L 23/522* (2006.01)
*H01L 21/768* (2006.01)
*H01P 1/203* (2006.01)
*H01P 5/12* (2006.01)
*H03H 7/38* (2006.01)

(56) References Cited

U.S. PATENT DOCUMENTS

| | | | |
|---|---|---|---|
| 5,075,646 A * | 12/1991 | Morse | H01P 5/187 |
| | | | 333/116 |
| 5,202,657 A | 4/1993 | Stopper | |
| 5,438,167 A | 8/1995 | McClanahan et al. | |
| 5,446,425 A * | 8/1995 | Banba | H01P 5/187 |
| | | | 333/116 |
| 5,499,445 A | 3/1996 | Boyle et al. | |
| 5,634,208 A * | 5/1997 | Nishikawa | H01P 3/088 |
| | | | 333/1 |
| 5,818,313 A | 10/1998 | Estes et al. | |
| 6,353,189 B1 * | 3/2002 | Shimada | H01L 21/563 |
| | | | 174/255 |
| 6,429,959 B1 | 8/2002 | Gopalakrishnan et al. | |
| 6,518,864 B1 | 2/2003 | Ito et al. | |
| 6,888,427 B2 * | 5/2005 | Sinsheimer | H01P 3/081 |
| | | | 333/238 |
| 7,088,201 B2 * | 8/2006 | Piernas | H01P 5/187 |
| | | | 333/116 |
| 7,103,488 B2 | 9/2006 | Goren et al. | |
| 7,265,644 B2 | 9/2007 | Floyd et al. | |
| 7,295,032 B2 | 11/2007 | Otsuka et al. | |
| 7,307,497 B2 | 12/2007 | Joodaki | |
| 7,397,320 B1 * | 7/2008 | Bokhari | H01P 3/081 |
| | | | 333/1 |
| 7,586,195 B2 | 9/2009 | Pruvost et al. | |
| 7,626,476 B2 | 12/2009 | Kim et al. | |
| 8,106,728 B2 | 1/2012 | Ding et al. | |
| 8,207,451 B2 | 6/2012 | Lu et al. | |
| 8,212,634 B2 | 7/2012 | Mina et al. | |
| 8,324,979 B2 | 12/2012 | Cho | |
| 8,362,608 B2 | 1/2013 | Ju et al. | |
| 8,451,072 B2 * | 5/2013 | Wyland | H01L 23/66 |
| | | | 333/12 |
| 8,497,742 B2 * | 7/2013 | Lee | H01P 3/003 |
| | | | 333/1 |
| 8,508,314 B2 | 8/2013 | Ding et al. | |
| 8,542,075 B2 | 9/2013 | Wu et al. | |
| 8,680,689 B1 | 3/2014 | Daubenspeck et al. | |
| 8,809,956 B2 * | 8/2014 | Cho | H01L 23/5223 |
| | | | 257/351 |
| 8,859,300 B2 | 10/2014 | Ding et al. | |
| 8,917,150 B2 | 12/2014 | Vanhille et al. | |
| 9,362,606 B2 * | 6/2016 | Dewitt | H01P 3/081 |
| 2006/0015276 A1 | 1/2006 | Goren et al. | |
| 2008/0079170 A1 | 4/2008 | Pruvost et al. | |
| 2009/0108369 A1 | 4/2009 | Chu | |
| 2010/0096678 A1 | 4/2010 | Subramanyam | |
| 2010/0164653 A1 | 7/2010 | Cho | |
| 2010/0214041 A1 | 8/2010 | Cho | |
| 2010/0252870 A1 | 10/2010 | Lin et al. | |
| 2010/0265011 A1 | 10/2010 | Ding et al. | |
| 2010/0315181 A1 | 12/2010 | Mina et al. | |
| 2012/0175626 A1 | 7/2012 | Erickson et al. | |
| 2013/0002375 A1 * | 1/2013 | Yang | H01L 23/5225 |
| | | | 333/238 |
| 2013/0082802 A1 | 4/2013 | Elad et al. | |
| 2014/0239427 A1 | 8/2014 | Huang et al. | |
| 2014/0266919 A1 | 9/2014 | Chen | |

* cited by examiner

Simulation structure of 3D microstrip line

Simulation structure of conventional microstrip line

Simulation structure of 3D microstrip line

Simulation structure of 3D microstrip line

ON-CHIP VERTICAL THREE DIMENSIONAL MICROSTRIP LINE WITH CHARACTERISTIC IMPEDANCE TUNING TECHNIQUE AND DESIGN STRUCTURES

FIELD OF THE INVENTION

The invention relates to integrated circuits and, more particularly, to a vertical three dimensional (3D) microstrip line structure for improved tunable characteristic impedance, methods of manufacturing the same and design structures.

BACKGROUND

Transmission lines are important elements in circuit applications. For example, transmission lines typically provide the on-chip interconnect between active and passive devices of circuits, and are also utilized as impedance matching elements. A microstrip line is a type of transmission line widely utilized in microwave integrated circuit applications. Specifically, a microstrip line is a type of electrical transmission line that can be fabricated using printed circuit board technology, and may be used to convey microwave-frequency signals. Microwave components such as antennas, couplers, filters, power dividers, etc. can be formed from microstrip lines, the entire device existing as the pattern of metallization on a substrate.

Generally, microstrip lines comprise a signal line over a ground plane, which may be a solid metal plane, with a dielectric layer or layers separating the signal line from the ground plane. The ground plane has the advantageous feature of isolating the signal line from the substrate. Therefore, any substrate-induced losses are reduced. However, the formation of the ground plane also incurs drawbacks. As the scaling of back end of the line (BEOL) processes continues to trend downward, the vertical distance between the signal line and the ground plane becomes significantly smaller. This requires the signal line to be increasingly narrower in order to achieve the desired characteristic impedance. Consequently, insertion losses in microstrip lines become increasingly more significant, and demand better impedance matching between microstrip lines and network devices. Furthermore, the ground plane becomes a barrier for tuning the characteristic impedance of microstrip lines. This is due to the limited vertical distance between the signal line and the ground plane (i.e., a smaller distance with little room for tuning).

Moreover, the on-chip interconnect is one of the most significant factors that limit chip performance. Therefore, in a high performance integrated circuit design, an accurate model of the on-chip transmission line is needed for proper design. For example, in complementary metal-oxide-semiconductor (CMOS) technology, the effect of low resistivity silicon substrate coupling to the microstrip lines increases the on-chip transmission line insertion loss. Therefore, the substrate coupling should be taken into consideration in the modeling of any microstrip line implemented in CMOS technology. However, conventionally there is no accurate tool available to model the substrate effect. Consequently, modeling errors due to the substrate effect may cause an inaccuracy of the characteristic impedance and attenuation of the on-chip transmission line. Additionally, for Millimeter Wave/Terahertz applications the conventional on-chip interconnects suffer from reflections due to impedance mismatch that impact the signal integrity.

Accordingly, there exists a need in the art to overcome the deficiencies and limitations described hereinabove.

SUMMARY

In a first aspect of the invention, a method is provided that includes forming a first microstrip line structure within a BEOL stack. The method further includes forming a second microstrip line structure separated from the BEOL stack by a predetermined horizontal distance.

In another aspect of the invention, a structure is provided that includes a BEOL stack including a plurality of metallization layers and a plurality of dielectric layers. The structure further includes a first microstrip line structure on a first vertical plane that runs through the BEOL stack. The structure further includes a second microstrip line structure on a second vertical plane that runs outside confines of the BEOL stack. The second vertical plane is at a predetermined horizontal distance from the BEOL stack.

In another aspect of the invention, a design structure tangibly embodied in a machine readable storage medium for designing, manufacturing, or testing an integrated circuit is provided. The design structure includes the structures of the present invention. In further embodiments, a hardware description language (HDL) design structure encoded on a machine-readable data storage medium includes elements that when processed in a computer-aided design system generates a machine-executable representation of a three dimensional (3D) microstrip line, and integrated circuit containing the same, which includes the structures of the present invention. In still further embodiments, a method in a computer-aided design system is provided for generating a functional design model of the 3D microstrip line. The method includes generating a functional representation of the structural elements of the 3D microstrip line.

In yet another aspect of the invention, a design structure readable by a machine is used in design, manufacture, or simulation of an integrated circuit. The design structure being implemented in the machine and including a BEOL stack comprising a plurality of metallization layers and a plurality of dielectric layers. The design structure further including a first microstrip line structure on a first vertical plane that runs through the BEOL stack. The design structure further including a second microstrip line structure on a second vertical plane that runs outside confines of the BEOL stack. The second vertical plane is at a predetermined horizontal distance from the BEOL stack.

BRIEF DESCRIPTION OF THE SEVERAL VIEWS OF THE DRAWINGS

The present invention is described in the detailed description, which follows, in reference to the noted plurality of drawings by way of non-limiting examples of exemplary embodiments of the present invention.

DETAILED DESCRIPTION

The invention relates to integrated circuits and, more particularly, to a vertical three dimensional (3D) microstrip line structure for improved tunable characteristic impedance, methods of manufacturing the same and design structures. In embodiments, the 3D microstrip line structure of the present invention can be used for Millimeter Wave/Terahertz applications such as antennas, couplers, filters, and power dividers. The 3D microstrip line structure of the present invention also provides added flexibility compared to conventional 2D microstrip line structure, e.g., the characteristics impedance of the 3D microstrip line structure can be designed for a wide range of applications.

In embodiments, separate vertical stacks comprising the signal line and the ground plane are used in the design of the 3D microstrip line structure. In embodiments, the separate vertical stacks may be formed in a same dielectric layer; however, symmetrical along different vertical planes running parallel to one another and perpendicular to a top surface of a dielectric layer. Accordingly, dielectrics on both the top and bottom of the 3D microstrip line structure are the same; instead of different dielectrics in conventional 2D microstrip line structures. This confines the electric field of the microstrip line structure within the same dielectrics (e.g., the BEOL dielectrics) such that it is easier to accurately model the on-chip 3D microstrip line structure (as illustrated in the comparison between FIGS. 1a and 1b).

Figure 1A:
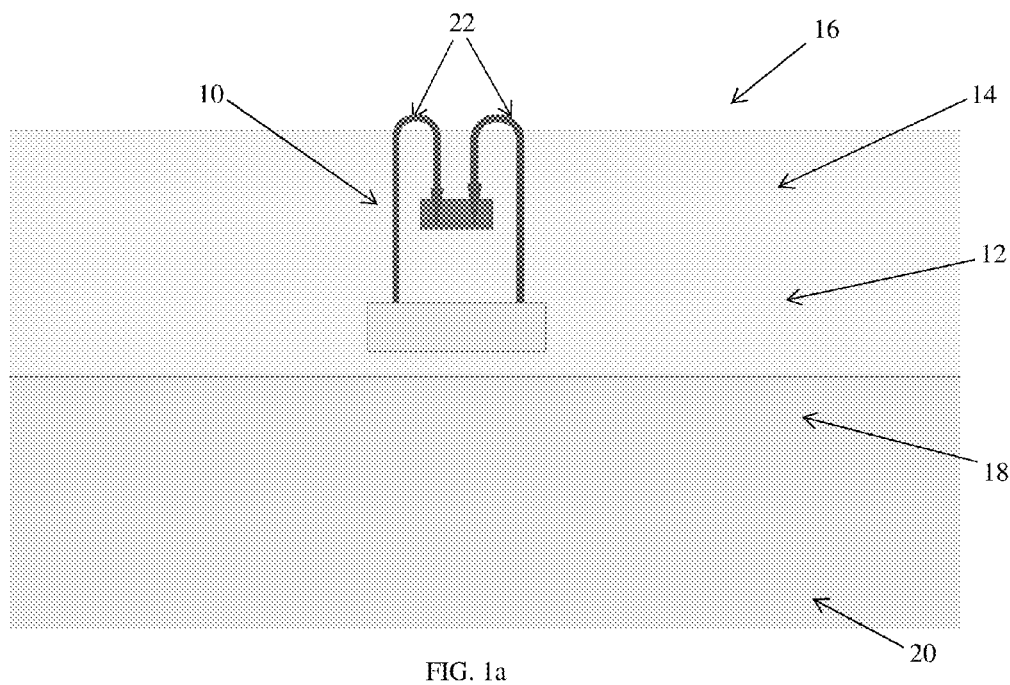
FIG. 1a shows a conventional horizontal 2D microstrip line structure.

Specifically, FIG. 1a shows that in conventional 2D microstrip line structures the dielectrics on the top and bottom of the microstrip line are not the same. For example, in FIG. 1a the dielectrics on the top of the microstrip line 10 include a thin oxide layer 12, a polymide nitride layer 14, and air 16, and the material (e.g., dielectrics) on the bottom of the microstrip line include a thick oxide layer 18 and the silicon substrate 20 (i.e., the electric field 22 of the 2D microstrip line 10 extends from the BEOL dielectrics into the polyimide nitride layer 14 and the air 16). Thus, there are problems with modeling the conventional 2D microstrip line because its electric field extends through multiple environments.

Figure 1B:
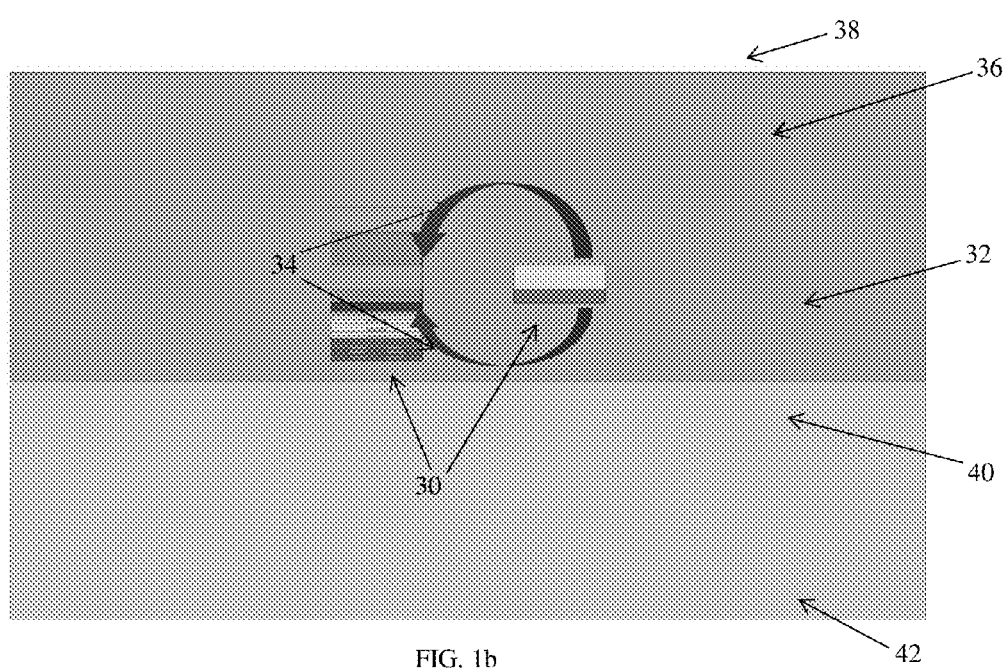
FIG. 1b shows a vertical 3D microstrip line structure in accordance with aspects of the present invention.

Alternatively, in accordance with aspects of the of the present invention, FIG. 1b shows that in the 3D microstrip line structure of the present invention the dielectrics on the top and bottom of the microstrip line are the same. For example, in FIG. 1b the dielectrics on both the top and bottom of the 3D microstrip line 30 include only the oxide layer 32 (i.e., the electric field 34 of the 3D microstrip line 30 is confined within the BEOL dielectrics and outside of the confines of the polymide nitride layer 36, the air 38, the thick oxide layer 40, and the silicon substrate 42). Thus, there are no problems with modeling of the 3D microstrip line because its electric field is confined within a single environment.

In further embodiments, the ground plane of the present invention is provided within a metal wiring layer of the BEOL stack and the signal line is provided off to the side of the ground plane (e.g., outside the confines of the BEOL stack) in a different vertical plane; compared to being stacked on top of one another in a same vertical plane as in conventional 2D microstrip line structures. This allows for the thickness of the signal line to not be limited by the BEOL metallization layers and for the distance between the signal line and the ground plane to not be limited by the BEOL dielectric thickness such that it is easier to tune the impedance characteristic of the 3D microstrip line structure for a wide range of applications.

Advantageously, the on-chip 3D microstrip line structure of the present invention has better insertion loss compared to conventional 2D microstrip line structures due to a reduction of substrate coupling loss. Additionally, the 3D microstrip line structure of the present invention is easier to model due to its symmetrical intrinsic design, thereby eliminating modeling errors. Moreover, the 3D microstrip line structure of the present invention can be designed for a wide range of applications by easily changing the width of the signal line and/or the distance between the signal line and ground plane. Accordingly, implementing the 3D microstrip line structure of the present invention will allow for improved tunable characteristic impedance compared to conventional systems.

Figure 2:
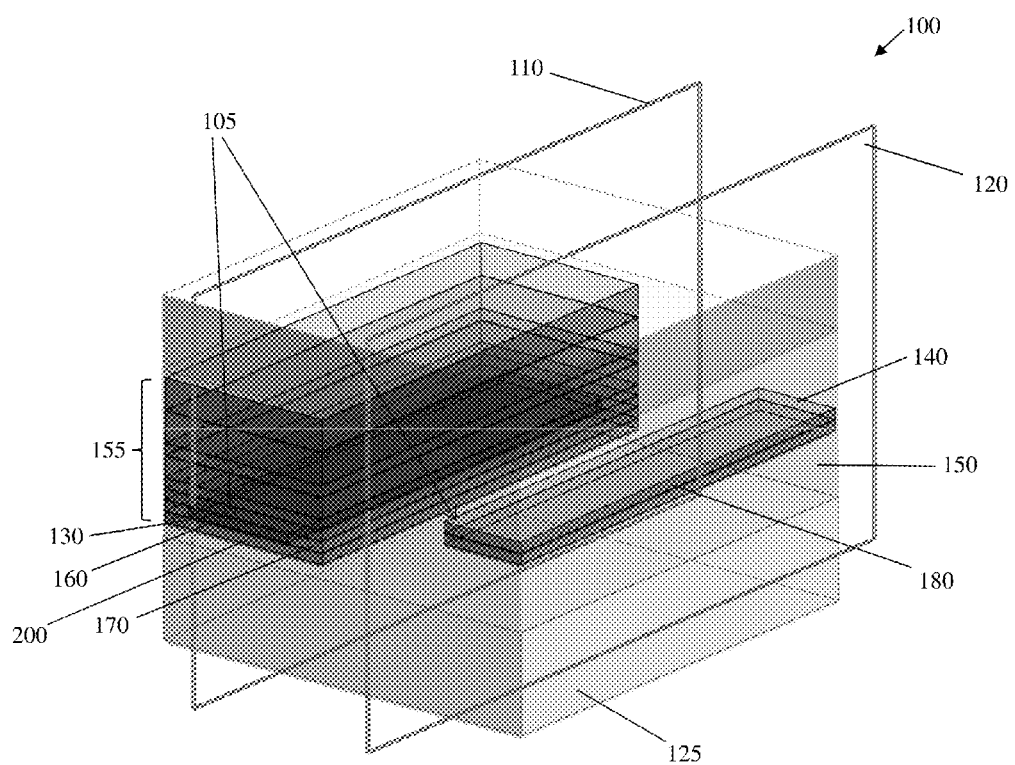
FIGS. 2-4 show structures and respective manufacturing steps in accordance with aspects of the present invention.

FIG. 2 shows a 3D microstrip line structure and methods of manufacturing in accordance with aspects of the present invention. It should be understood by those of skill in the art that the microstrip line structure and other components, e.g., BEOL wiring layers, etc. of the present invention, can be manufactured in a number of ways using a number of different tools. In general, though, the methodologies and tools used to form the structures of the present invention can be adopted from integrated circuit (IC) technology. For example, the structures of the present invention, e.g., signal lines, ground plates, inductance lines, etc., are built on wafers and are realized in films of materials patterned by photolithographic processes. In particular, the fabrication of structures uses three basic building blocks: (i) deposition of films of material on a substrate, (ii) applying a patterned mask on top of the films by photolithographic imaging, and (iii) etching the films selectively to the mask.

More specifically, the structure 100 of FIG. 2 includes a microstrip line structure 105 formed within two different vertical planes 110 and 120 that are parallel to one another and perpendicular to a top surface of a substrate 125. In embodiments, the microstrip line structure 105 comprises ground plate 130 formed symmetrical along the vertical plane 110 and a signal line 140 formed symmetrical along the vertical plane 120. The ground plate 130 and the signal line 140 are thus considered formed side-to-side or horizontal to one another and not formed vertically over one another. In embodiments, the ground plate 130 and the signal line 140 are formed in a dielectric material 150, formed on the surface of the substrate 125, e.g., silicon. More specifically, in embodiments, the dielectric material 150 is BEOL dielectrics comprising a plurality of dielectric layers (e.g., oxide layers).

In embodiments, the ground plate 130 is formed within the BEOL stack 155 comprising a plurality of metallization layers interconnected therein. More specifically, the ground plate 130 may be formed as a part of a lower metallization layer 160 in a portion of an oxide layer 170 of the BEOL stack 155. The signal line 140, on the other hand, may be formed in a portion of another oxide layer 180 that is adjacent to the BEOL stack 155 and separated from the BEOL stack 155 by dielectric material (e.g., outside the confines of the BEOL stack and separated there from by a predetermined distance).

In embodiments, the ground plate 130 and the signal line 140 can be fabricated using conventional CMOS processes, with the ground plate 130 and the signal line 140 being formed respectively on two different vertical planes 110 and 120. The ground plate 130 and the signal line 140 may be formed at the same or different layers of the structure. More specifically, in embodiments, the ground plate 130 and signal line 140 of the microstrip line structure 100 may be fabricated from any metal or metal alloy material using conventional lithographic, etching and deposition processes commonly employed in CMOS fabrication (e.g., using an additive or subtractive metal process). For example, in embodiments, the metal or metal alloy can be deposited using conventional deposition processes such as, for example, atomic layer deposition (ALD), metal sputtering, or a chemical vapor deposition (CVD), amongst other deposition methods. The metal or metal alloy can be any known metal or metal alloy, suitable for its particular purpose, e.g., copper structures. In embodiments, the dielectric layers (e.g., oxide layers 180 and 190) of the present invention can be, for example, $SiO_2$, deposited prior to or after the deposition of the metal or metal alloy.

By way of more specific example, oxide layer 200 of the dielectric material 150 can be deposited over the surface of the substrate 125 using, for example, a conventional CVD process. After deposition of the oxide layer 200 over the surface of the substrate 125, a resist layer can be placed on the oxide layer 200 and exposed to light to form patterns, corresponding with a pattern of vias (not shown) designed to connect the lower metallization layer 160 to the substrate 125 (e.g., transistors formed in the substrate 125). The oxide layer 200 is then patterned, e.g., etched, to form the vias, which may contact underlying metal layers or devices such as transistors. This etching can be, for example, conventional processes such as reactive ion etching (RIE). After etching, the resist may be removed using a conventional ashing or stripping process. A metal or metal alloy layer, e.g., copper or tungsten, is then deposited in the etched trenches to form the vias. Any residual metal or metal alloy can then be removed using chemical mechanical polishing (CMP). Similarly, vias can be formed in additional oxide layers between the various metallization layers of the BEOL stack to form a connected BEOL stack.

Similarly, the oxide layers 170 and 180 can be deposited over the surface of the substrate 125 using, for example, a conventional CVD process. In embodiments, the oxide layers 170 and 180 can be formed in different processing steps in different horizontal planes. In alternative embodiments, the oxide layers 170 and 180 may be the same oxide layer formed in a same horizontal plane and can be formed in the same processing step.

In embodiments, the ground plate 130 and the signal line 140 can be formed in different processing steps, in different horizontal and vertical planes. In alternative embodiments, the ground plate 130 and the signal line 140 can be formed in the same processing step, in a same horizontal plane but different vertical planes. In embodiments, the ground plate 130 and the signal line 140 can be formed using a damascene process using an additive or subtractive process.

Specifically and by way of one example, after deposition of the oxide layer 170, a resist layer can be formed on the oxide layer 170 and exposed to light to form patterns, corresponding with a shape of the ground plate 130. The exposed regions of the oxide layer 170 are then etched to form trenches using conventional processes such as, for example, reactive ion etching. A metal or metal alloy layer may then be deposited in the trenches to form the ground plate 130. The metal or metal alloy can then undergo a chemical mechanical polishing (CMP) process. Similarly, after deposition of the oxide layer 180, the signal line 140 may be formed therein. It should be understood by those of ordinary skill in the art that the ground plate 130 and the signal line 140 can be formed in other oxide layers above the underlying devices, e.g., transistors. In this way, the ground plate 130 will be formed in a part of the BEOL stack 155 at any desired layer depending on design and performance criteria.

Figure 3:
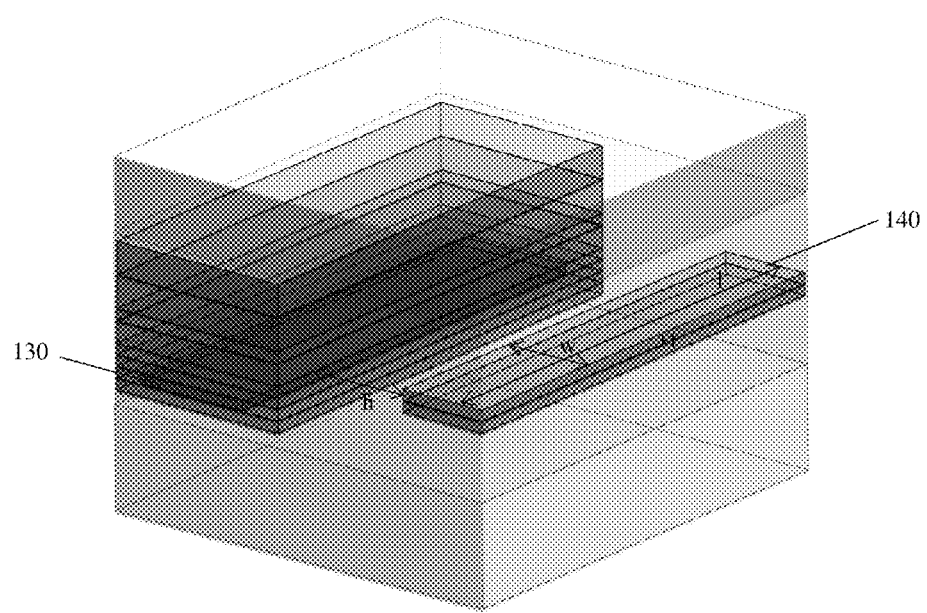

In embodiments, the ground plate 130 and the signal line 140 can have uniform thicknesses and lengths; although many different configurations are contemplated by the present invention. For example, the ground plate 130 and the signal line 140 can have varied thicknesses or different lengths, etc. Additionally, in accordance with aspects of the present invention and as illustrated in FIG. 3, the width ("w") of the signal line 140 may be varied over a large range only bounded by the width of the oxide layer in which the signal line 140 is formed. Also, the horizontal distance "h" or the spacing/separation between the vertical BEOL stack (comprising the ground plate 130) and the signal line 140 may be varied over a large range only bounded by the width of the oxide layer in which the signal line 140 is formed. Accordingly, characteristic impedance of the microstrip line structure 100 can be tuned by varying the widths, spacing between the signal line and the vertical ground plate, as well as the thicknesses. In embodiments, the signal line 140 has a length ("l") of about 200 µm, a width ("w") of about 1-10 µm, a thickness ("t") of about 1.8 µm and a spacing ("h") of about 2-4 µm, and is made of Cu. In other embodiments, the length, width, spacing and thickness of the signal line may be different.

Figure 4:
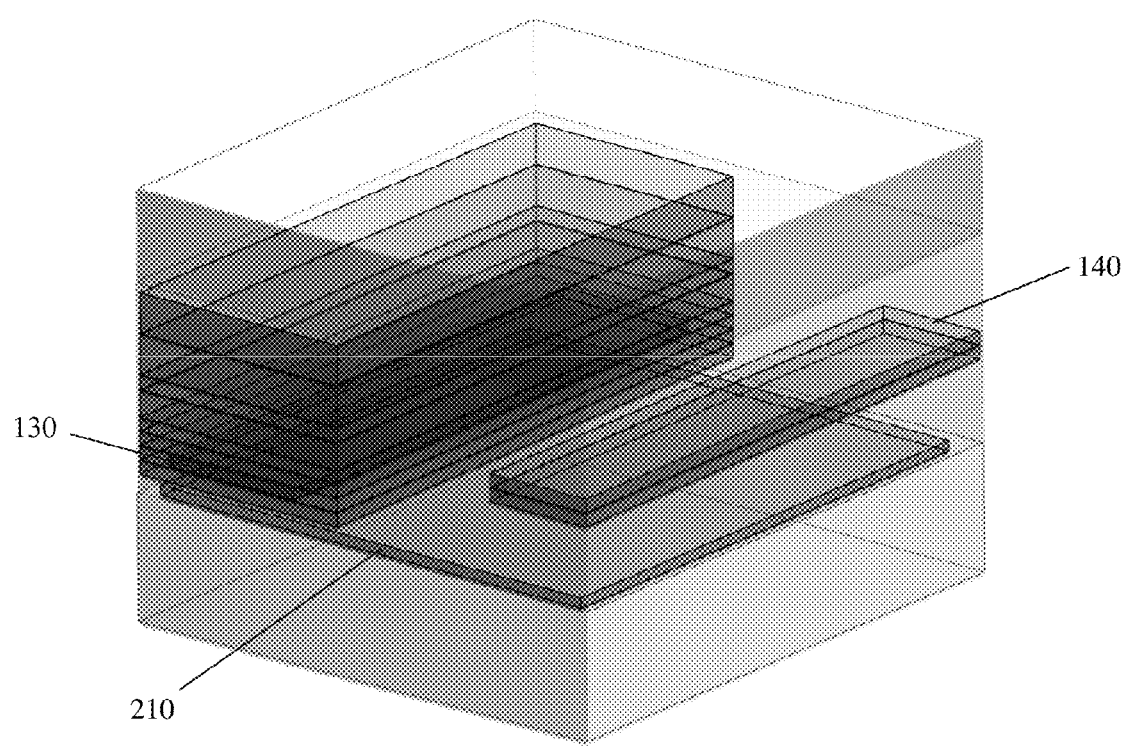

FIG. 4 shows that in additional or alternative embodiments, an optional metal strip 210 may be formed below the ground plate 130 and the signal line 140 in order to further minimize the insertion loss due to the substrate coupling. In embodiments, the metal strip 210 can be formed as two separate metal strips with one metal strip below the ground plate 130 and one metal strip below the signal line 140 in different processing steps, in different horizontal and vertical planes. In alternative embodiments, the metal strip 210 can be formed as a single metal strip (shown in FIG. 4) extending below both the ground plate 130 and the signal line 130, formed in the same processing step in a same horizontal plane. In embodiments, the metal strip 210 can be made of Cu and formed using a damascene process using an additive or subtractive process within an oxide layer as described herein.

Figure 5:
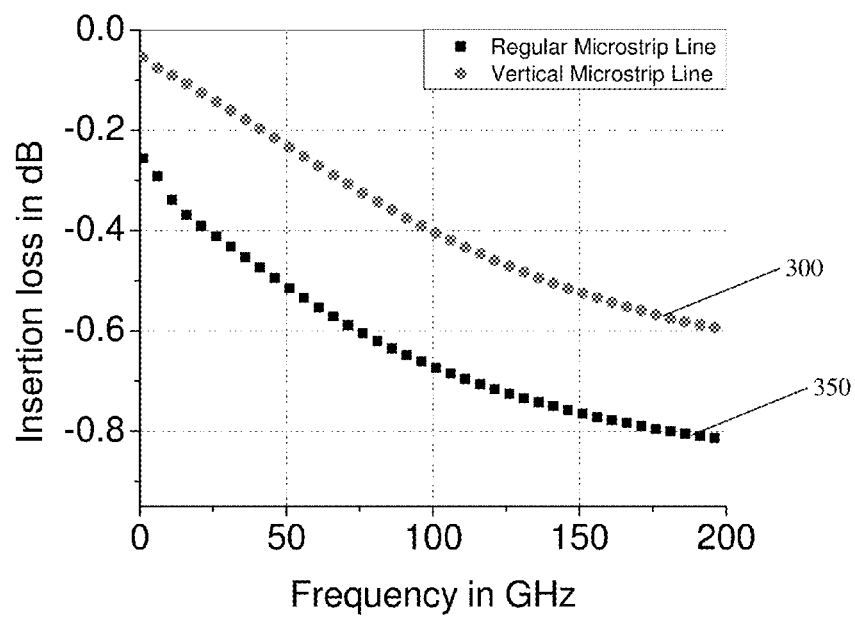
FIGS. 5-7 show various performance graphs of structures implementing aspects of the present invention.
Figure 5:
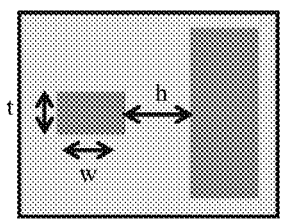
Figure 5:
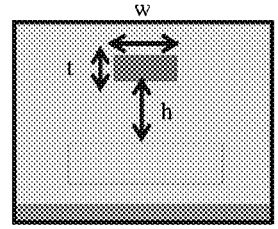
Figure 6:
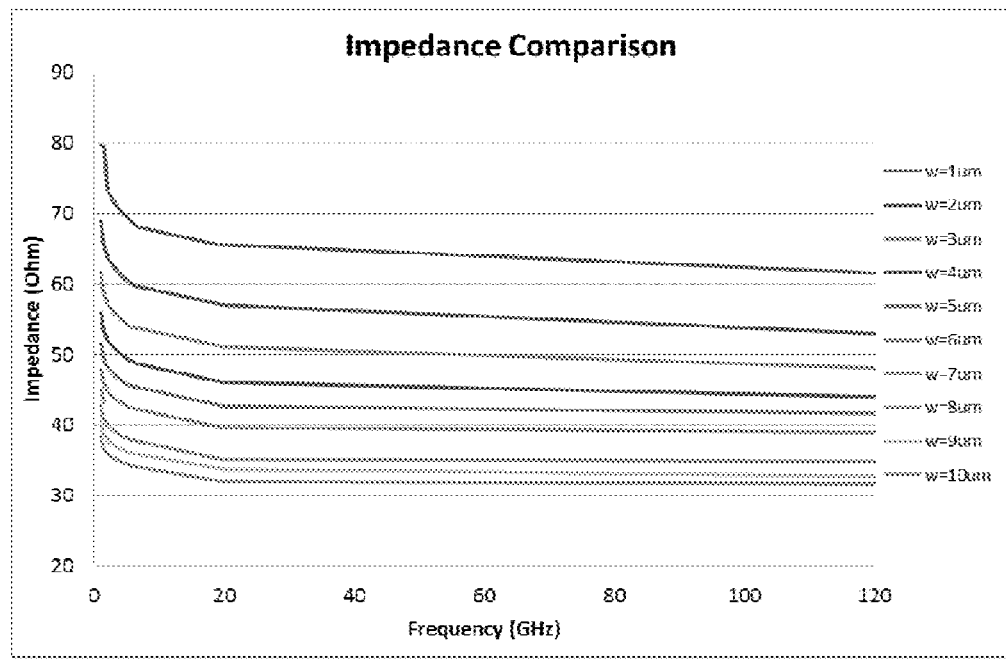
Figure 6:
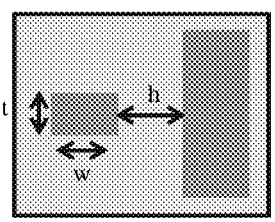
Figure 7:
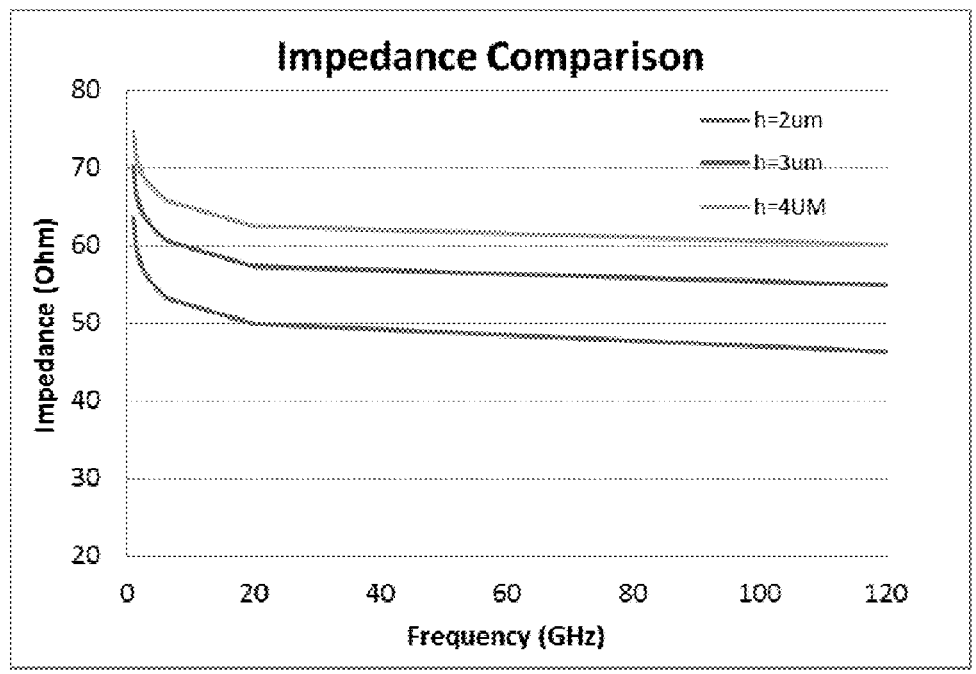
Figure 7:
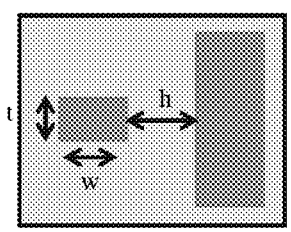

FIGS. 5-7 show various performance graphs of structures implementing aspects of the present invention. More specifically, FIGS. 5-7 show various performance graphs of the microstrip line structure shown in FIGS. 2 and 3. These graphs show that the microstrip line structures shown in FIGS. 2 and 3 have better insertion loss compared with traditional microstrip line structures. Also these graphs show the characteristic impedance of the microstrip line may be varied by changing the width ("w") of the signal line and the spacing ("h") between the signal line and the BEOL stack comprising the ground plate. Similar performance achievements are also obtained with the structure described with regard to FIG. 4.

More specifically, FIG. 5 shows insertion loss for a vertical 3D microstrip line structure in accordance with aspects of the present invention compared to the insertion loss for the conventional horizontal 2D microstrip line structure. In FIG. 5, the x axis is frequency and the y axis is insertion loss in dB. More particularly, FIG. 5 shows that at a frequency of 100 GHz, the insertion loss of the vertical 3D microstrip line structure 300 is about −0.4 dB and the insertion loss of the conventional horizontal 2D microstrip line structure 350 is about −0.65 dB. Consequently, FIG. 5 shows that the 3D microstrip line structure of the present invention provides for better insertion loss compared to conventional 2D microstrip line structures due to a reduction of substrate coupling loss.

FIG. 6 shows impedance comparison for the vertical 3D microstrip line structure in accordance with aspects of the present invention. In FIG. 6, the x axis is frequency and the y axis is impedance in ohms. More particularly, FIG. 6 shows that as the width ("w") of the signal line is increased from 1 μm to 10 μm while holding all other variables of the device the same (e.g., the spacing ("h") between the signal line and the BEOL stack comprising the ground plate), the impedance decreases from about 65 ohms at 60 GHz to about 32 ohms at 60 GHz.

FIG. 7 shows impedance comparison for the vertical 3D microstrip line structure in accordance with aspects of the present invention. In FIG. 7, the x axis is frequency and the y axis is impedance in ohms. More particularly, FIG. 7 shows that as the spacing ("h") between the signal line and the BEOL stack comprising the ground plate is increased from 2 μm to 4 μm while holding all other variables of the device the same (e.g., the width ("w") of the signal line), the impedance decreases from about 62 ohms at 60 GHz to about 48 ohms at 60 GHz.

Consequently, FIGS. 6 and 7 show that the 3D microstrip line structure of the present invention can be designed for a wide range of applications by easily changing the width of the signal line and/or the distance between the signal line and ground plate. Accordingly, implementing the 3D microstrip line structure of the present invention will allow for improved tunable characteristic impedance compared to conventional systems.

Figure 8:
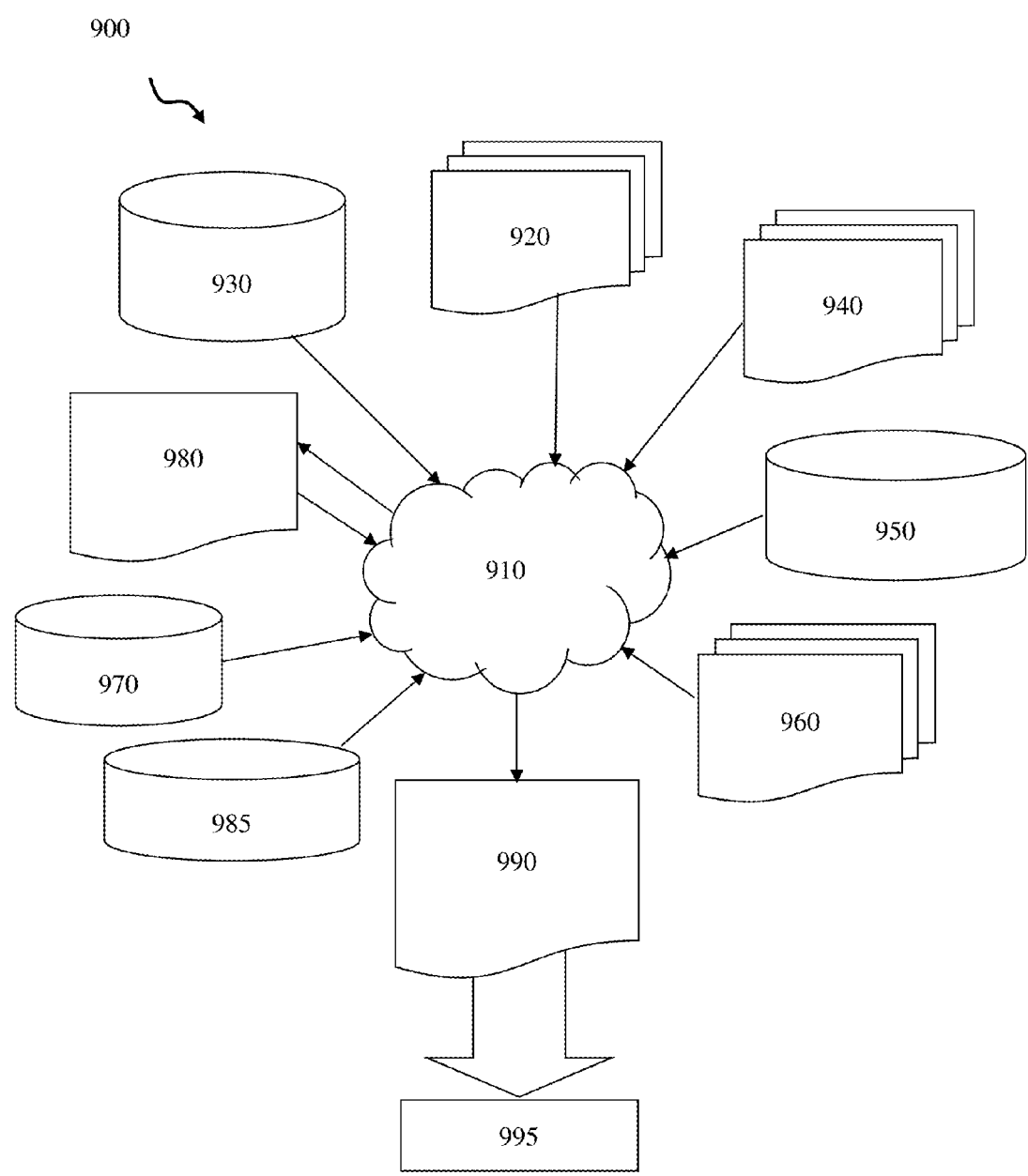
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1b and 2-4. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures in any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1b and 2-4. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1b and 2-4 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention.

Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1*b* and 2-4. In one embodiment, design structure 990 may comprise a compiled, executable HDL simulation model that functionally simulates the devices shown in FIGS. 1*b* and 2-4.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1*b* and 2-4. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    forming a first microstrip line structure comprising a ground plate within a back end of the line (BEOL) stack; and
    forming a second microstrip line structure comprising a signal line separated from the BEOL stack by a predetermined horizontal distance,
    forming a first metal strip below the ground plate and a second metal strip below the signal line such that the first metal strip is formed in a different horizontal plane than the second metal strip, wherein:
    the ground plate is formed on a first vertical plane that intersects the BEOL stack and in a portion of an oxide layer of the BEOL stack;
    the signal line is formed on a second vertical plane that avoids intersecting the BEOL stack and in a portion of another oxide layer that is separated from the BEOL stack, and
    the oxide layer of the BEOL stack is different from the another oxide layer that is separated from the BEOL stack.

2. The method of claim 1, wherein:
    the ground plate is formed symmetrical along the first vertical plane that intersects the BEOL stack; and
    the signal line is formed symmetrical along the second vertical plane that avoids intersecting the BEOL stack.

3. The method of claim 1, wherein the BEOL stack is over a substrate, the first vertical plane is parallel to the second vertical plane, and the first vertical plane and the second vertical plane are perpendicular to a top surface of the substrate.

4. The method of claim 1, wherein the predetermined horizontal distance from the BEOL stack is selected to achieve a predetermined impedance.

5. The method of claim 4, wherein the predetermined horizontal distance is about 2-4 μm.

6. The method of claim 1, wherein the second microstrip line structure is formed with a predetermined width that is selected to achieve a predetermined impedance.

7. The method of claim 1, wherein the first microstrip line structure and the second microstrip line structure are formed using complementary metal oxide semiconductor (CMOS) technology.

8. A structure, comprising:
    a back end of the line (BEOL) stack comprising a plurality of metallization layers and a plurality of dielectric layers;
    a first microstrip line structure comprising a ground plate on a first vertical plane that intersects the BEOL stack and formed in a portion of an oxide layer of the dielectric layers of the BEOL stack;
    a second microstrip line structure comprising a signal line on a second vertical plane that avoids intersecting the BEOL stack, the second vertical plane being at a predetermined horizontal distance from the BEOL stack and being formed in a portion of another oxide layer different than the dielectric layers, that is separated from the BEOL stack;
    a first metal strip formed below the ground plate; and a second metal strip formed below the signal line and in a different horizontal plane than the first metal strip.

9. The structure of claim 8, further comprising a substrate, wherein the BEOL stack is over the substrate, the first vertical plane is parallel to the second vertical plane, and the first vertical plane and the second vertical plane are perpendicular to a top surface of the substrate.

10. The structure of claim 8, wherein:
the first microstrip line structure is symmetrical along the first vertical plane that intersects the BEOL stack; and
the second microstrip line structure is symmetrical along the second vertical plane that avoids intersecting the BEOL stack.

11. The structure of claim 8, wherein the second microstrip line structure has a predetermined width that is selected to achieve a predetermined impedance.

12. The structure of claim 8, wherein the predetermined horizontal distance is about 2-4 μm.

* * * * *